United States Patent
Benedix et al.

(10) Patent No.: US 7,065,687 B2
(45) Date of Patent: Jun. 20, 2006

(54) METHOD FOR REPLACING DEFECTIVE MEMORY CELLS IN DATA PROCESSING APPARATUS

(75) Inventors: Alexander Benedix, München (DE); Reinhard Dueregger, Poing (DE); Wolfgang Ruf, Friedberg (DE)

(73) Assignee: Infineon Technologies AG, Munich (DE)

( * ) Notice: Subject to any disclaimer, the term of this patent is extended or adjusted under 35 U.S.C. 154(b) by 447 days.

(21) Appl. No.: 10/253,465

(22) Filed: Sep. 24, 2002

(65) Prior Publication Data

US 2003/0061532 A1    Mar. 27, 2003

(30) Foreign Application Priority Data

Sep. 24, 2001  (DE) ................................. 101 46 931

(51) Int. Cl.
*G11C 29/00*  (2006.01)
*G11C 7/00*   (2006.01)

(52) U.S. Cl. ................ 714/718; 714/710; 365/200

(58) Field of Classification Search ................ 714/718, 714/723, 721, 719, 710, 711, 5, 6, 7, 8, 30, 714/31, 42; 365/200, 201; 711/100, 104, 711/105, 202, 206
See application file for complete search history.

(56) References Cited

U.S. PATENT DOCUMENTS

| | | | |
|---|---|---|---|
| 4,630,241 A * | 12/1986 | Kobayashi et al. | 365/200 |
| 4,939,694 A   | 7/1990  | Eaton et al.     | 365/200 |
| 5,313,424 A   | 5/1994  | Adams et al.     | 365/200 |
| 5,469,390 A * | 11/1995 | Sasaki et al.    | 365/200 |
| 5,659,551 A   | 8/1997  | Huott et al.     | 714/725 |
| 5,706,231 A * | 1/1998  | Kokubo           | 365/200 |
| 5,758,056 A * | 5/1998  | Barr             | 714/7   |

* cited by examiner

*Primary Examiner*—Christine T. Tu
(74) *Attorney, Agent, or Firm*—Laurence A. Greenberg; Werner H. Stemer; Ralph E. Locher

(57) ABSTRACT

A method for replacing defective memory cells of a random access memory device of a data processing apparatus, in which, during the operation of the data processing apparatus, a defective memory cell is replaced by a replacement memory cell in the random access memory device by using a control instruction.

5 Claims, 1 Drawing Sheet

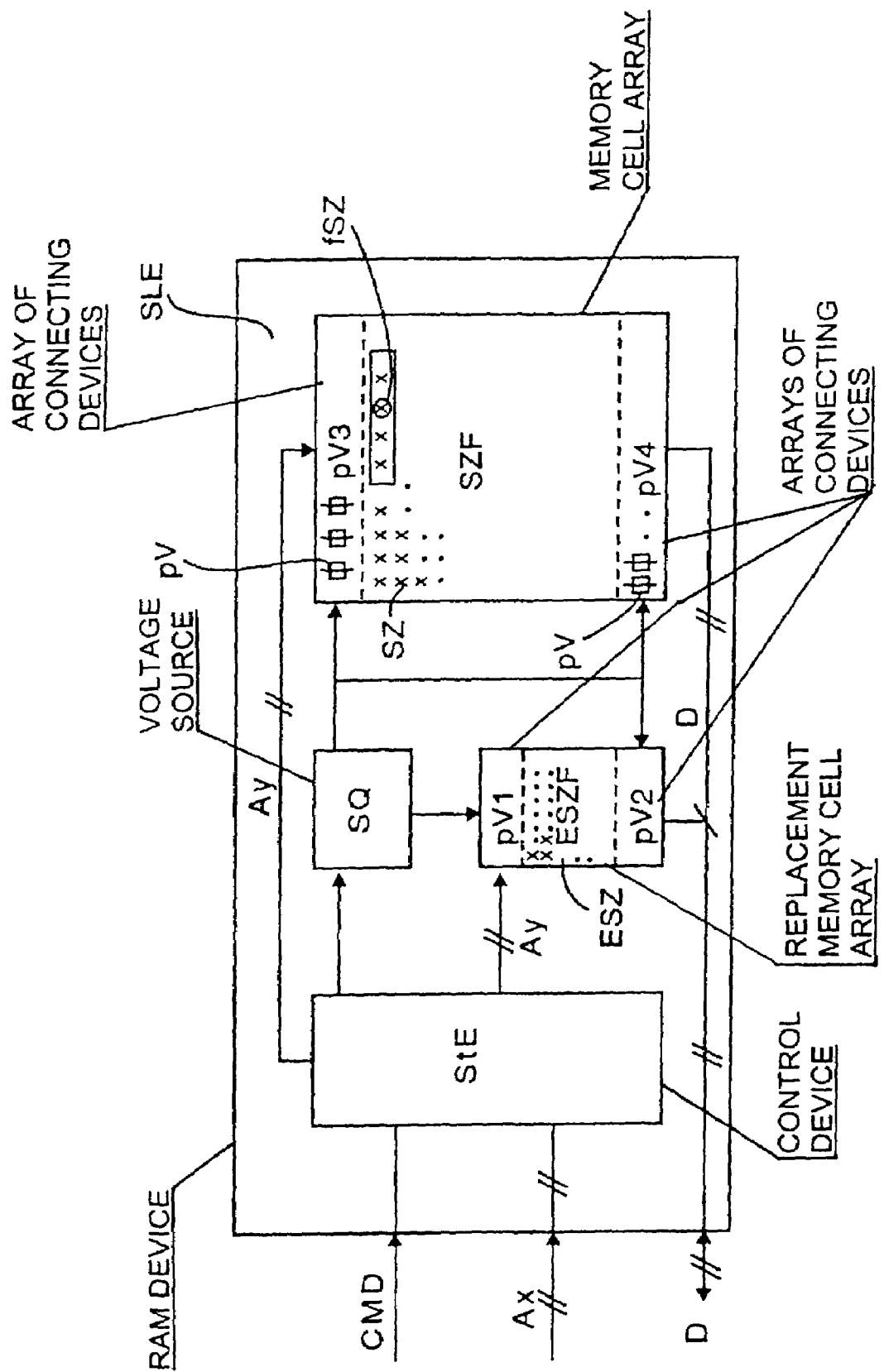

METHOD FOR REPLACING DEFECTIVE MEMORY CELLS IN DATA PROCESSING APPARATUS

BACKGROUND OF THE INVENTION

Field of the Invention

The invention relates to a method for replacing defective memory cells in a random access memory device of a data processing apparatus. The random access memory device has replacement memory cells and programmable connecting devices. The data processing apparatus is able to identify defective memory cells in an operating state and to store the addresses of the defective memory cells. The invention furthermore relates to a configuration that enhances random access memory devices for the inventive method.

The process of storing data in a random access memory device (hereinafter RAM) of a data processing apparatus is occasionally performed with errors. A datum output by the RAM is then altered relative to the (stored) datum originally written in. Permanent memory errors (hard errors) and sporadic, volatile memory errors (soft errors) are differentiated according to their occurrence.

Permanent memory errors are usually caused by line interruptions in the random access memory device.

Volatile errors may be caused by interference pulses that have a source within or outside the random access memory device. An accumulation of volatile errors at an identical memory address of the random access memory device may indicate a weakness of one of the addressed memory cells that occurs only under specific operating conditions.

Erroneous storage operations are usually detected by parity checking methods (EDC: error detection control) in data processing apparatus.

In the simplest case, a group of individual data bits stored under a common address (a data word) is assigned at least one parity bit which supplements the bits of the data word to form an even or odd checksum.

Only an odd number of errors per data word are identified with a parity bit. Checking methods using more than one parity bit can be utilized to identify multiple errors within a data word. However, the number of errors that can be identified per data word always remains limited.

If a sequence controller of the data processing apparatus identifies an erroneous data word by using a parity checking method, it stores the memory address under which the erroneous data word was stored, in a nonvolatile memory device.

Afterward, the sequence controller either masks out at least the memory address of the erroneous data word (hereinafter error address) or continues to operate without further measures, and the error address is subsequently accessed again and again.

In both cases, the processes otherwise proceeding on the data processing apparatus are slowed down.

If the error addresses are not masked out, moreover, there is an increase in the probability of an erroneous memory access and thus indirectly also in the probability of a memory error that cannot be identified by the parity check.

Thus, random access memory devices with erroneous memory addresses must be replaced precisely in data processing apparatus of which high reliability requirements are made. The data processing apparatus must generally be deactivated in order to exchange such random access memory devices. The data processing apparatus must be reactivated after the mechanical exchange of the random access memory device. Deactivating and starting up a data processing apparatus may include complex, time-consuming work operations. The availability of the data processing apparatus is restricted by the deactivation.

In the fabrication of random access memory devices, it is customary practice nowadays to provide replacement memory cells in the random access memory device. These memory cells are activated for instance at the end of a test cycle of the random access memory device in a test environment in order to replace defective memory cells in the random access memory device.

SUMMARY OF THE INVENTION

It is accordingly an object of the invention to provide a configuration and a method for replacing defective cells in a random access memory device which overcomes the above-mentioned disadvantages of the prior art apparatus and methods of this general type.

In particular, it is an object of the invention to provide a method in which, in the operating state of a data processing apparatus, defective memory cells of a random access memory device of the data processing apparatus can be masked out and replaced by replacement memory cells situated in the random access memory device. It is likewise an object of the invention to provide a configuration in a random access memory device having replacement memory cells that can be assigned to addresses of defective memory cells.

With the foregoing and other objects in view there is provided, in accordance with the invention, a method for replacing defective memory cells in a random access memory device of a data processing apparatus. The method includes steps of: providing the random access memory device with replacement memory cells and programmable connecting devices; configuring the data processing apparatus to identify the defective memory cells in an operating state and to store addresses of the defective memory cells; and in the operating state, assigning the addresses of the defective memory cells to replacement memory cells such that the replacement memory cells replace the defective memory cells.

In accordance with an added feature of the invention, the method includes: providing the random access memory device with a control device that controls replacing the defective memory cells using programmable connecting devices.

In accordance with an additional feature of the invention, the method includes: actuating the control device with a control instruction for replacing the defective memory cells.

In accordance with another feature of the invention, the method includes: providing the control instruction with at least the address of the defective memory cells, an identifier specific to the replacement, and a code.

In accordance with a further feature of the invention, the method includes: transmitting the code in at least three parts each including a mode identifier transmitted via control lines and an input mode transmitted via address lines.

In accordance with a further added feature of the invention, the method includes: providing the random access memory device as a dynamic random access memory; and providing the replacement memory cells as static memory cells.

In accordance with a further additional feature of the invention, the method includes: providing the random access memory device with a dynamic random access memory; and providing the replacement memory cells as static memory cells.

With the foregoing and other objects in view there is provided, in accordance with the invention, a configuration for replacing defective memory cells in a random access memory device. The configuration includes: a control device; a plurality of programmable connecting devices; a plurality of replacement memory cells; and a voltage source for generating a programming voltage required for programming the plurality of the programmable connecting devices. The control device is for evaluating an additional control instruction. The control device is for driving the voltage source and the plurality of the programmable connecting devices such that one of the plurality of the replacement memory cells is connected to an address of one of the defective memory cells.

In accordance with an added mode of the invention, the random access memory device is a dynamic random access memory or includes a dynamic random access memory.

In the case of the method, in the operating state of a data processing apparatus, by using programmable connecting devices, defective memory cells of a random access memory device are turned off and replacement memory cells are turned on instead. In this case, the replacement memory cells and the programmable connecting devices are those that are also used for instance at the end of a test cycle of the random access memory device in a test environment in order to replace defective memory cells in the random access memory device. In this case, the exchange always includes at least the smallest individually addressable group of memory cells (hereinafter memory address).

Since the procedure takes place while the data processing apparatus is in operation, deactivation and subsequent reactivation of the data processing apparatus are not necessary. The availability of the data processing apparatus is significantly increased through the significantly shorter time spent for replacing defective memory cells by replacement memory cells as compared to mechanical exchanging random access memory devices.

If a control device situated in the random access memory device drives the programmable connecting devices, then it is advantageously possible to define a uniform interface between the data processing apparatus and the random access memory device for the purpose of replacing defective memory addresses.

Such an interface is then preferably a control instruction in an instruction set of the random access memory device. The control instruction is transmitted as required from the data processing apparatus to the random access memory device.

The control instruction then contains, in addition to its specific identifier (e.g. "fuse"), the memory address to be replaced, and in an advantageous manner, a code or coding that is specific to the random access memory device and prevents inadvertent, erroneous or unauthorized use of the control instruction.

The code or coding is preferably effected in three parts, in each case, a mode identifier is transmitted on control lines and an input mode is transmitted on the address lines.

A sequence controller containing control instructions for replacing defective memory addresses is advantageously stored in a specially protected memory area of the data processing apparatus, for instance, as firmware, as part of the BIOS (basic input output operating system), or as part of the operating system of the data processing apparatus. Thus, the sequence controller for replacing defective memory addresses can proceed largely independently of other components of the data processing apparatus and access to the sequence controller can be restricted for instance by using a customer service mode.

Random access memory devices already having replacement memory cells and programmable connecting devices for replacing defective memory cells in a test environment, such as for example, DRAMs (dynamic random access memories), are preferably suitable for being used with the inventive method.

In order to enable the programmable connecting devices to also be programmed outside a test environment, that is to say, for instance, in a data processing apparatus, it is necessary to provide a voltage source in the random access memory device. This voltage source uses the internal voltages of the random access memory device to generate the programming voltage required for programming the connecting devices. Furthermore, it is necessary to supplement the control device in the random access memory device such that the control instruction for replacing defective memory cells is evaluated and implemented.

Other features which are considered as characteristic for the invention are set forth in the appended claims.

Although the invention is illustrated and described herein as embodied in a method for replacing defective memory cells in data processing apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The sole drawing FIGURE is a block diagram of a random access memory device.

DESCRIPTION OF THE PREFERRED EMBODIMENTS

In this illustration, the terms memory cell and replacement memory cell in each case encompass a group of jointly addressable individual memory cells.

Referring now to the sole drawing FIGURE, there is shown a random access memory device SLE having a control device StE, a memory cell array SZF including memory cells SZ, and a replacement memory cell array ESZF including replacement memory cells ESZ. The memory cell array SZF and the replacement memory cell array ESZF are connected both to internal address lines Ay and to a data bus D.

The arrays pV1 to pV4 diagrammatically represent realization possibilities for arrays of programmable connecting devices pV, that is to say, for instance, electrical fuses and antifuses.

If there is the intention to replace a defective memory cell fSZ at an error address from the memory cell array SZF, then via the control lines CMD, the data processing apparatus transmits an identifier for the replacement of an error address. This error address is transmitted via the address lines Ax of the defective memory cell fSZ to the control device StE of the random access memory device SLE.

The control device StE thereupon activates a voltage source SQ. By way of example, programmable connecting devices pV in the array pV4 are subsequently driven in such a way that at least the defective memory cell fSZ is isolated from the data bus D. At the same time, replacement memory cells ESZ from the replacement memory cell array ESZF are correspondingly connected to the error address via connecting devices in the array pV1. Thus, at the error address, a defective memory cell fSZ has been replaced by a replacement memory cell ESZ from the replacement memory cell array ESZF.

As an alternative, it is also possible for defective memory cells to be disconnected via programmable connecting devices pV in the array pV3 and for replacement memory cells to be connected via connecting devices in the array pV2.

We claim:

1. A method for replacing defective memory cells in a random access memory device of a data processing apparatus, the method which comprises:
   providing the random access memory device with replacement memory cells, programmable connecting devices, and a control device for controlling replacing defective memory cells using the programmable connecting devices;
   configuring the data processing apparatus to identify the defective memory cells in an operating state and to store addresses of the defective memory cells; and
   in the operating state, actuating the control device with a control instruction for replacing the defective memory cells, and assigning the addresses of the defective memory cells to replacement memory cells such that the replacement memory cells replace the defective memory cells, and providing a code specific to the random access memory device for preventing inadvertent, erroneous, or unauthorized use of the control instruction, such that access to the control device is restricted by using a specific service mode.

2. The method according to claim 1, which comprises: transmitting the code in at least three parts each including a mode identifier transmitted via control lines and an input mode transmitted via address lines.

3. The method according to claim 1, which comprises: providing the random access memory device as a dynamic random access memory; and providing the replacement memory cells as static memory cells.

4. A configuration for replacing defective memory cells in a random access memory device, the configuration comprising:
   a control device for evaluating a control instruction;
   a plurality of programmable connecting devices;
   a plurality of replacement memory cells;
   a voltage source for generating a programming voltage required for programming said plurality of said programmable connecting devices; and
   said control device for driving said voltage source and said plurality of said programmable connecting devices such that one of said plurality of said replacement memory cells is connected to an address of one of the defective memory cells, said control instruction having at least the address of the defective memory cells, an identifier specific to the replacement, and a code specific to the random access memory device for preventing inadvertent, erroneous or unauthorized use of the control instruction, such that access to the control device is restricted by using a specific service mode.

5. The configuration according to claim 4, in combination with the random access memory device, wherein the random access memory device is a dynamic random access memory.

* * * * *